United States Patent
Fjelstad

(10) Patent No.: US 7,466,021 B2
(45) Date of Patent: Dec. 16, 2008

(54) MEMORY PACKAGES HAVING STAIR STEP INTERCONNECTION LAYERS

(75) Inventor: Joseph Charles Fjelstad, Maple Valley, WA (US)

(73) Assignee: Interconnect Portfolio, LLP, Cupertino, CA (US)

( * ) Notice: Subject to any disclaimer, the term of this patent is extended or adjusted under 35 U.S.C. 154(b) by 473 days.

(21) Appl. No.: 11/381,357

(22) Filed: May 2, 2006

(65) Prior Publication Data

US 2006/0244150 A1   Nov. 2, 2006

Related U.S. Application Data

(63) Continuation-in-part of application No. 10/987,187, filed on Nov. 12, 2004, now Pat. No. 7,388,279.

(60) Provisional application No. 60/519,945, filed on Nov. 17, 2003, provisional application No. 60/676,863, filed on May 2, 2005.

(51) Int. Cl.
*H01L 23/04* (2006.01)

(52) U.S. Cl. .................. 257/698; 257/700; 257/701; 257/723; 257/725; 257/773; 257/E23.004; 257/E23.065; 257/E23.067; 257/E23.069; 257/E23.178

(58) Field of Classification Search .............. None
See application file for complete search history.

(56) References Cited

U.S. PATENT DOCUMENTS

| | | | |
|---|---|---|---|
| 6,121,679 A * | 9/2000 | Luvara et al. | 257/700 |
| 7,014,472 B2 * | 3/2006 | Fjelstad et al. | 439/65 |
| 2005/0093152 A1 * | 5/2005 | Fjelstad et al. | 257/738 |
| 2008/0143707 A1 * | 6/2008 | Mitchell | 345/418 |

* cited by examiner

*Primary Examiner*—David E Graybill
(74) *Attorney, Agent, or Firm*—Ronald R. Shea, Esq.

(57) ABSTRACT

Disclosed are IC package structures having stair stepped layers and which have no plated vias. Such structures can be fabricated either as discrete packages or as strips such as might be beneficial in for use with memory devices wherein critical or high speed signals can be routed along the length of the multi-chip strip package without having to have the signals ascend and descend from the interconnection substrate on which the assembly is mounted to the IC package termination and back as the signal transmits between devices.

10 Claims, 7 Drawing Sheets

MEMORY PACKAGES HAVING STAIR STEP INTERCONNECTION LAYERS

CROSS-REFERENCE TO RELATED APPLICATIONS

This filing claims priority as a continuation in part of U.S. patent application Ser. No. 10/987,187 by Joseph C. Fjelstad, et al., filed Nov. 12, 2004 now U.S. Pat. No. 7,388,279, and entitled "Tapered Dielectric and Conductor Structures and Applications Thereof," which claims priority from U.S. Provisional Application 60/519,945 filed Nov. 17, 2003 and entitled "Memory Package and Structures Created Therefrom," both of which are herein incorporated by reference. This filing also claims priority from U.S. Provisional Application 60/676,863 by Joseph C. Fjelstad, filed May 2, 2005, and entitled "Memory Packages Having Stair Step Interconnection Layers," which is also incorporated by reference herein. This application also incorporates by reference U.S. application Ser. No. 10/947,686 filed Sep. 9, 2004 by Joseph C. Fjelstad, and Entitled Multi-Surface IC Packaging Structures and Methods for Their Manufacture, and U.S. application Ser. No. 10/964,578 Filed Oct. 12, 2004 by Joseph C. Fjelstad, et al., and entitled Multi-Surface Contact IC Packaging Structures and Assemblies.

FIELD OF THE INVENTION

The present invention relates to the field of high speed electronic interconnections for memory and the packaging of semiconductor integrated circuits for use therewith.

BACKGROUND

Memory integrated circuits "ICs" for use with most computers operate at speeds slower than current generation central processing unit "CPU" ICs creating a condition generally referred to as the "memory bottleneck". In such condition, the CPU must remain in a wait state until the memory data is written or retrieved. The problem has been addressed, in part, by improved memory system designs. However as electronic systems move into the multi-gigabit per second data rate range, a significant gap remains between top-end operating rates of CPU ICs and memory ICs. Part of this ongoing disparity is due to the limits of current interconnection design, which often results, particularly at higher frequencies, in disturbances that contribute to signal distortion. For example, signal distortion can often be due, at least in part to so-called parasitic effects resulting from traditional interconnect designs. Because signal speed and signal integrity are two primary goals in digital signal transmission, interconnect designs that assure signal integrity during data transmission are key. Controlling signal integrity begins with the design of the circuit. Choices made in terms of circuit layout, and the materials used and the general architecture of the complete assembly, will all have impact of the quality if the signal transmission and its ultimate integrity.

Because parasitic effects and signal discontinuity are primary sources of signal disturbance, one of the major objectives in maintaining signal integrity is to eliminate or minimize the parasitic effects and electrical discontinuities impinging upon a signal. Parasitic effects and electrical discontinuities are caused by a number of factors such as sharp changes in direction, changes in material, circuit feature flaws and even interconnections, such as solder balls used to connect IC packages to next level interconnection substrates. All these can affect signal integrity by introducing undesirable changes in impedance and creating signal reflections. There is also concern about signal skew, cause by differing signal lengths, which is important in assuring proper signal timing.

The first place in an electronic system such parasitic effects are encountered, beyond those encountered within the IC structure itself, is the IC package which is used to connect the IC die to a next level interconnection system. While current generation IC packages are presently reasonably well suited to meeting current needs, as the electronics industry moving to ever higher data signaling rates, the formerly minor concerns associated with packages and interconnection paths have now reached a level of critical importance.

The net effect of this complex web of interactive elements is that they collectively combine to make it extremely difficult to predict and design for reliable high performance at higher processing speeds. Additionally, at higher processing speeds, parasitic effects and signal discontinuities and reflections can contribute to the thermal demands placed on a system. Thus, as memory circuit speeds climb, there is need for new approaches to design of memory package interconnections to overcome the looming and highly complex electrical and thermal problems associated with traditional approaches to IC memory packaging.

BRIEF DESCRIPTION OF THE DRAWINGS

The present invention is best illustrated by way of example, and not by way of limitation, in the figures of the accompanying drawings and in which like reference numerals refer to similar elements and in which.

DETAILED DESCRIPTION

Disclosed herein using descriptions and figures are IC package structures having stair step connections for use with memory devices and which improve control of the quality of an electronic signal that passes though a memory chip package and between memory chips. Moreover, the nature of the memory package assembly disclosed offers a structure better suited to thermal management than current package designs.

The embodiments disclosed herein address the limitations of current design and manufacturing practices employed in the fabrication of electronic memory device and system interconnections and the present inability of those design and manufacturing practices to address fully and adequately the needs for improved electronic signal integrity as the electronic signal transitions between memory chips on an electronic memory module.

An objective of the present disclosure to describe memory package structures which provide direct and uniform controlled impedance across the surface of a memory package by routing high speed signals on a controlled impedance first layer.

Another objective is to describe a first layer having one or more signal paths which provides a substantially skew free address line for clocking signals on the package while routing other signals, such as power and ground, on a second stair stepped layer wherein both metal layers are interconnected to the IC memory die.

It is yet another objective of the present disclosure to describe memory package structures which reduce the number of I/O required on the package due to the package structure's ability to transmit data directly between chips within the package.

It is yet another objective of the present disclosure to describe memory package structures which provide for improved thermal dissipation.

Figure 1:
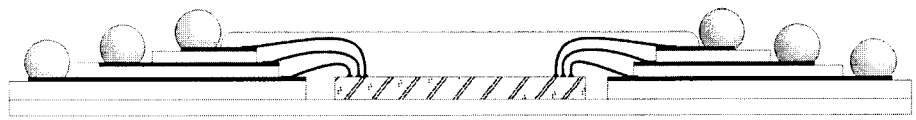
FIG. 1 shows an example of prior art.

The present embodiments offer novel alternative approaches to addressing and meeting the stated objectives thus solving certain problems associated with current design approaches. Throughout this disclosure, many specific details are recited which are not essential to make or use the embodiments described herein. Accordingly, these details are offered for purposes of clarity and enablement, and are not intended to limit the spirit and scope of the embodiments described herein, which includes variations and equivalent structures and processes. For example, the IC die (IC chip) is shown in the attached drawings as having two central rows of bond pads. The depiction of this detail is not intended to limit the scope or application of IC chips described herein. Alternative embodiments such as those comprising a single row of bond pads, or more than two rows of bond pads are fully intended as falling within the scope of the embodiments described herein. The advantages are best illustrated with figures as show herewith, wherein:

FIG. 1 depicts an embodiment previously disclosed in U.S. patent application Ser. No. 10/964,578 (Publication 20050093152). A single chip IC package structure having stair stepped electrical interconnections on more than one level and interconnected by means of wires.

Figure 2:
FIG. 2 shows an example of prior art.

FIG. 2 depicts an embodiment of a previously disclosed IC package structure for interconnecting stacked memory packages having electrical interconnections on two surfaces and interconnected to a common IC contact by means of wires, which each connect to a different level and eliminating electrical stubs.

Figure 3:
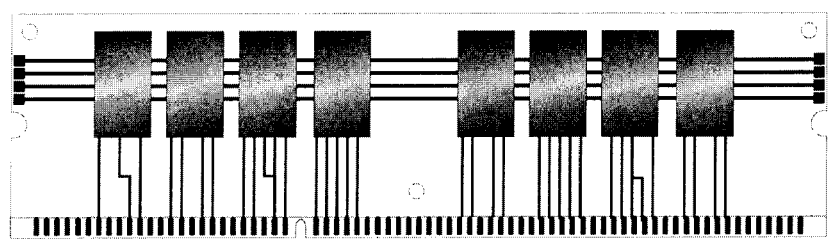
FIG. 3 shows an example of prior art.

FIG. 3 depicts an embodiment disclosed in U.S. Pat. No. 7,014,472. A memory module has high speed interconnections traversing the module assembly and disposed for interconnections at the distal ends of the assembly. Traditional interconnection(s) are displayed on the bottom of the memory module for interconnection to a connector such as a PC board mounted DIMM connector.

Figure 4:
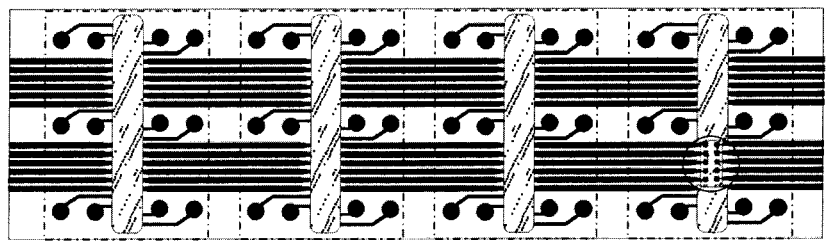
FIG. 4 shows an example of prior art.

FIG. 4 depicts an embodiment disclosed in U.S. patent application Ser. No. 10/987,187 in the form of a multi chip memory IC package structure in strip form wherein all of the interconnections are disposed on a common monolithic interconnection substrate in a single metal layer.

Figure 5:
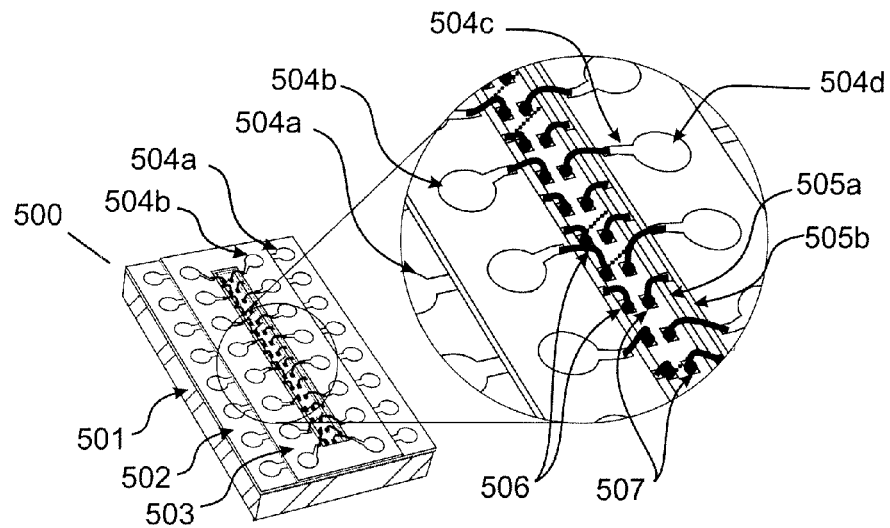
FIG. 5 shows an embodiment of a memory chip package assembly having a stair stepped interconnection layer.

FIG. 5 discloses a perspective view of a stair step memory IC package assembly 500 comprising a first dielectric material layer 502 disposed on top of an IC die 501. A first set of conductors and their respective terminations 504a are arranged along the exposed surface of the first dielectric layer 502. A second dielectric material layer 503 is disposed on top of the first dielectric layer. A second set of conductors and their respective terminations 504b are arranged along the exposed surface of the second dielectric layer. The conductors 504a and 504b include a narrow end 504c for connection to the IC die by means of interconnecting bond wires 506, and a flat circular region 504d for electrically engaging contact members (not shown) of a next level interconnection substrate (not shown). The first elongated aperture 505a is formed in dielectric material layer 502, and a second elongated aperture 505b is formed in dielectric layer 503. The two apertures 505a, 505b are aligned above each other to form a center access area providing egress for the bond wires 506 that electrically couple the conductors 504a, 504b to their respective termination contacts 507 in the IC die 501. The outer periphery of the second (upper) aperture 505b is slightly larger than the outer periphery of the first (lower) aperture 505a. The enlarged outer periphery of aperture in 505b serves to expose circuit wire bond terminations on 505a for wire bonding (or other suitable joining method) which are proximate to the inner edge of the aperture on dielectric material layer 502. Bond wires 506 are used to interconnect the IC die terminations 507 to the circuit terminations 504a and 504b on dielectric layers 502 and 503 respectively. While the structure is shown with only two layers of conductors, it is not so limited and more layers may be used if needed or desired. Those familiar with the art of PCB and IC package manufacture will know that an additional protective dielectric insulating layer, such as a solder mask or cover layer or by means of a build up polymer layer, is commonly applied to circuits leaving only the termination I/O exposed. For clarity of description this layer is omitted.

Figure 6:
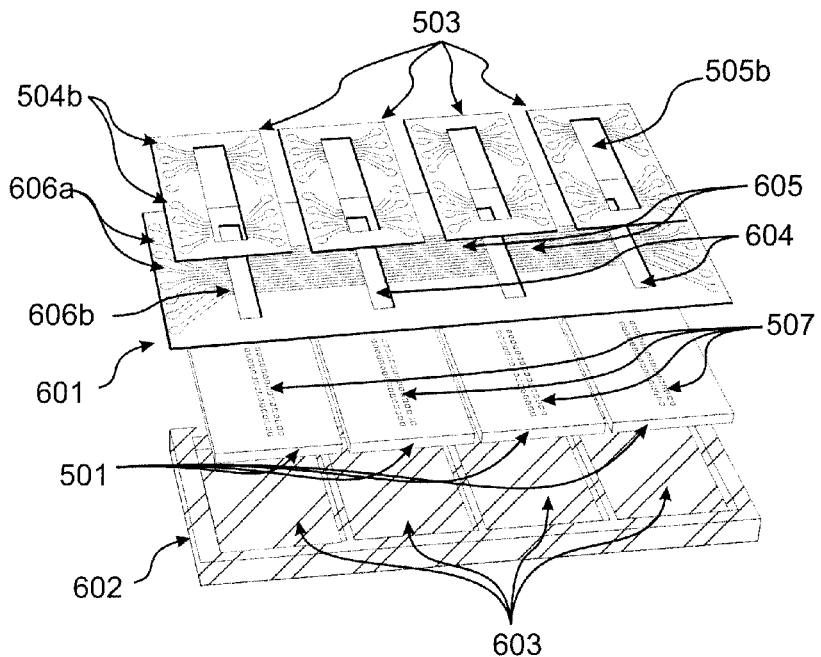
FIG. 6 shows an exploded perspective view of an embodiment of a multi-chip memory package assembly having a stair stepped interconnection layer.

FIG. 6 discloses an exploded perspective view of the elements of construction for an embodiment of multi-chip memory IC package assembly, including a plurality of IC die 501 positioned above an assembly support base structure (i.e. carrier) 602 which may be either permanent or temporary. In embodiments wherein the support base structure is temporary, the IC die 501 are removed from the support base 602 at some time after the first dielectric material layer 502 is bonded to the plurality of IC die 501. In embodiments wherein the support base structure 602 is a permanent part of the circuit, the IC die 501 are advantageously bonded to the carrier base.

The support base structure 602 has a plurality of cavities 603 having an appropriate size and shape for receiving respective IC die 501. According to an alternative embodiment, an individual die may be abutted directly against an adjacent die within a single cavity formed in the support base (carrier) structure 602, thereby eliminating the need for individual cavities 603 sized to securely receive a respective die. The die terminations 507 are arranged in dual lines along the center of each IC die (501). The dual-path alignment of die terminations 507 shown in FIG. 6 is offered only for example, and more or fewer paths are envisioned, as well as alternative shapes and alignments of die terminations, which can include, without limitation, alignments forming circular or elliptical shapes, spirals, star-shapes, and polygons.

A first dielectric layer 601 has a plurality of apertures 604 (analogous to 505*a*), each aperture forming an elongated linear shape configured to provide access to the dual line formation of the die terminations 507 formed on an upper surface of a respective die 501. The apertures, however, may be formed in any shape which will allow for exposure of and access to the die terminations 507. Conductors 605 disposed on the upper surface of the first dielectric layer include narrow conductive trace portions 606*b* that either terminate at large circular surface region 606*a* (analogus to 504*d* of FIG. 5), or at the edge of a respective aperture 604 formed in the first dielectric layer. Some of the conductors 605 do not have either end terminating at a large circular surface region 606*a*, but remain narrow conductive trace portions 606*b* having each end terminating at a different aperture, thereby functioning to connect adjacent IC die that are assembled within a common IC package. The distal ends of each of the narrow conductive trace portions 606*b* are oriented around the outer periphery of a respective aperture 604 in a predetermined arrangement configured to optimize direct connection between a conductor 605 and its respective die termination 507. Wire bonds are used couple the circuit ends of respective conductive trace portions to wire bond pads on a respective IC die, as illustrated in various figures herein, including FIGS. 5, 11, 12A and 13A. The large circular portions 606*a* can be used to accept solder balls (not shown) to facilitate interconnection of at least some of the conductors 605 as arranged on the surface of the first (lower) dielectric layer 601 for to a next level electronic element in the completed IC package assembly. It is not essential, however, that every conductor 605 is coupled to a signal source. Embodiments are envisioned wherein some of the conductors are unused. Similarly, it is not essential that every conductor 504*b* of the second dielectric layer (discussed below) be coupled to a signal source.

A plurality of second dielectric (insulating base material) layers 503 have elongated apertures 505*b* conforming to a shape and location of the arrays of die terminations 507. By making the die terminations accessible through the aligned upper and lower apertures 505*b*, 604, conductive bond wires can be coupled to respective die terminations during fabrication. A second plurality of electrical conductors 504*b* are arranged on the surface of the second dielectric layer in a predetermined arrangement to facilitate direct connection between a conductor 504*b* and its respective die termination 507. The conductors 504*b* on the plurality of second dielectric layers are also depicted as having a large circular surface region 504*d* and a narrow conductive trace 504*c*, as described in FIG. 5. The narrow conductive trace portions of these conductor are oriented around the outer periphery of a respective aperture 505*b* in a predetermined arrangement to facilitate direct connection between a conductor 504*b* and its respective die termination 507.

These upper dielectric layers 503 with circuits 504*b* are shown as individual and discrete circuit structures which are bonded to the base circuit layer 601. According to a first alternative embodiment, a single contiguous dielectric upper layer is disposed atop the lower dialectic layer 601 and secured by appropriate means. According to another alternative embodiment, the upper dielectric layer 503 could be fabricated on the base layer 601 using a build up layer or similar process. Moreover, while the structure of FIG. 6 is shown with only two conductive layers (i.e., dielectric layers 601, 503 having conductors 605, 504*b* disposed thereon), FIG. 6 is offered for illustrative purposes, and is not intended to limit the appended claims, which envision embodiments incorporating any number of conductive layers. By way of example, in another embodiment, the dielectric layer 601 may have a second metal layer on the side opposite the circuits 605. The second metal layer can function as a voltage source layer, a ground reference layer, or may provide additional circuit traces for select circuit connections other than ground, providing a micro-strip structure or sequence of signal traces that are configured to exhibit a desired impedance value, and/or trace lengths configured to equalize signal path lengths for select signals, thereby reducing or eliminating signal skew for select signals.

When the assembly is complete, it may be desirable to remove the support base by a suitable means to reduce the height of the completed assembly at which time an optional thin overmold (not shown) may be applied.

Figure 7:
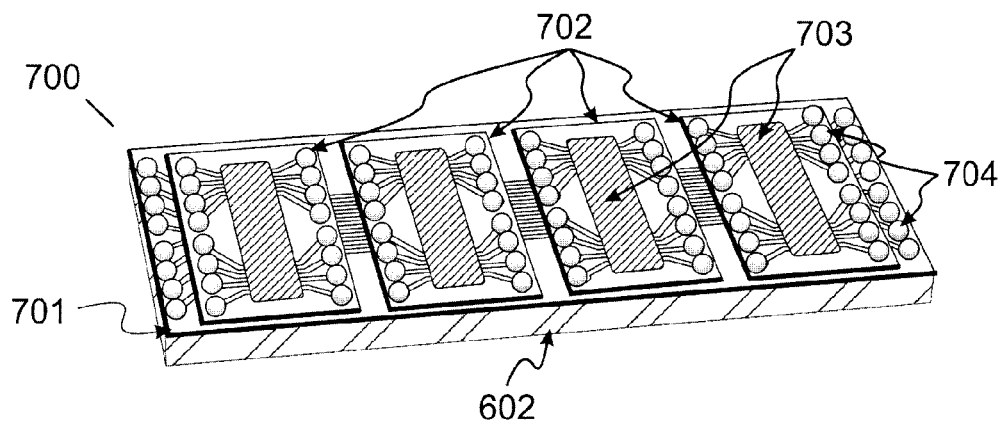
FIG. 7 show an embodiment of a multi-chip memory package assembly in assembled form with a plurality of discrete base materials having conductor patterns with I/O contacts which are each bonded to a common and shared base conductor pattern having its own separate I/O contacts.

FIG. 7 depicts a perspective view of the elements illustrated and defined in FIG. 6 in an assembled embodiment 700. The IC die (not visible) or a plurality of IC dies are disposed within the support base structure (carrier) 602. As discussed in conjunction with FIG. 6, the respective die may be disposed in individual cavity members, or abutted against each other in a single cavity. The first (lower) dielectric (i.e. insulator) layer 701 is bonded to the top of the IC memory die 501 (not shown in FIG. 7, visible in FIG. 6), to the peripheral edges of the carrier 602, or to both the die and the carrier. In embodiments wherein the die 501 are not permanently disposed within the carrier 602, the first (lower) dielectric layer 701 is bonded to the die only, and not to the carrier. A plurality of second (upper) dielectric layers 702 are bonded to or otherwise disposed or built up on the top surface of the first dielectric layer 701. In all embodiments disclosed herein, circuits of a lower dielectric layer can be coupled to respective IC terminals by bond wire prior to, or subsequent to, the bonding of the next upper dielectric layer(s) to a lower dielectric layer. Spatial limitations and manufacturing processes will inform the fabrication process of the most advantageous order for performing these respective steps. After all bond wires 506 from the various dielectric layers have been connected to their respective IC terminals 507 (FIG. 5), the apertures (FIG. 5) are filled with a suitable encapsulant 703. I/O terminations such as solder balls 704 are visible around the peripheries of the dielectric layers may be attached to the large circular surface regions (504*c* in FIG. 5).

Figure 8:
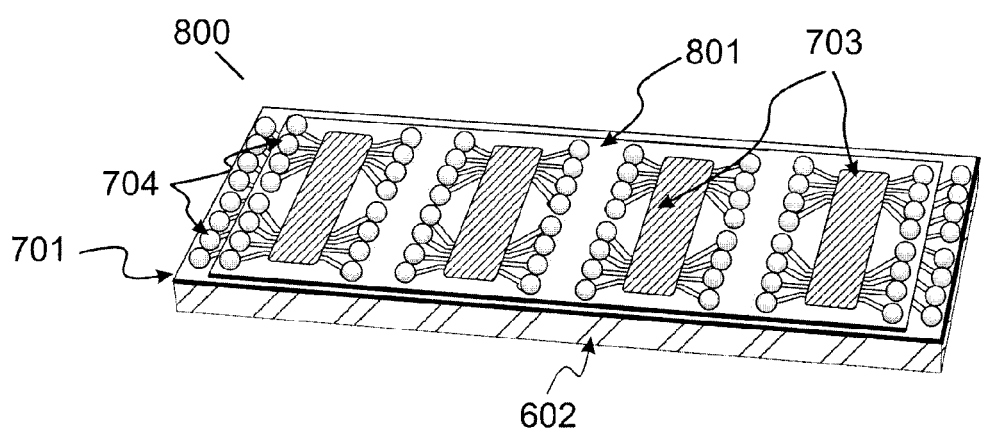
FIG. 8 show an embodiment of a multi-chip memory package assembly in assembled form with a continuous base material and having disposed on it a plurality of conductor patterns bonded to (or built up additively in a sequential process) a base conductor pattern and having I/O contacts having a joining material attached.

FIG. 8 depicts a perspective view of an IC package having a single upper dielectric layer 801 coupled across the top of the lower dielectric layer 701. A plurality of IC die 501 (visible in FIG. 6) are disposed within carrier 602. A lower dielectric strip (i.e. interconnection substrate) 701 is disposed above and coupled or attached to the top of the IC memory die, the periphery of the carrier, or both. In embodiments wherein the die 501 are not permanently disposed within the carrier 602, the first (lower) dielectric layer 701 is bonded to the die only, and not to the carrier. A second (upper) contiguous dielectric strip 801 bonded to the top of the first dielectric strip 701. The apertures (not visible) of the upper and lower dielectric strips are aligned during fabrication. After the bond wires 506 have been connected to their respective IC terminals 507 (FIG. 5), the apertures are filled with a suitable encapsulant 703. I/O terminations such as solder balls 704 visible around the peripheries of the dielectric layers may be attached to the large circular surface regions (504*d* in FIG. 5). In the embodiment depicted in FIG. 8, the second (upper) strip 801 is shown as being a formed from separate piece that is distinct from, and bonded, to the lower dielectric strip. However, alternative embodiments are envisioned wherein the upper dielectric strip is built up on the base circuit strip using build up layer circuit manufacturing techniques. The structure is shown with two circuit layers, each layer having separate conductive circuit pathways on insulating base materials. However, the specific number of dielectric layers shown in FIG. 8 is intended only as an example, and any number of dielectric layers may be used in conjunction with the embodiments described herein.

Figure 9:
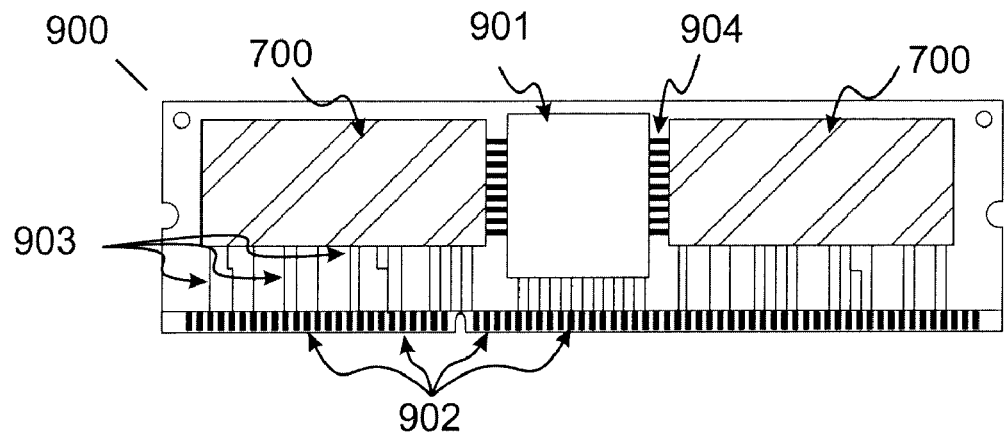
FIG. 9 shows an embodiment of memory module with multi-chip memory packages assembled to the surface of the memory module.

FIG. 9 depicts a side elevational view of the assembled multi chip memory packages 700 of FIG. 7 mounted on and interconnected to a memory module 900 such as a DIMM memory card. Centrally located on the module is an advanced memory buffer (AMB) package 901 which accesses and addresses the memory IC packages 700 by way of lateral signal paths 904, while power, ground and other signals for both the memory and AMB chip are accessed in traditional manner by way of conductors 903 connected to edge card terminations 902 on the memory module. The construction of the memory chip packages can be modified as desired to provide direct access to the AMB.

Figure 10:
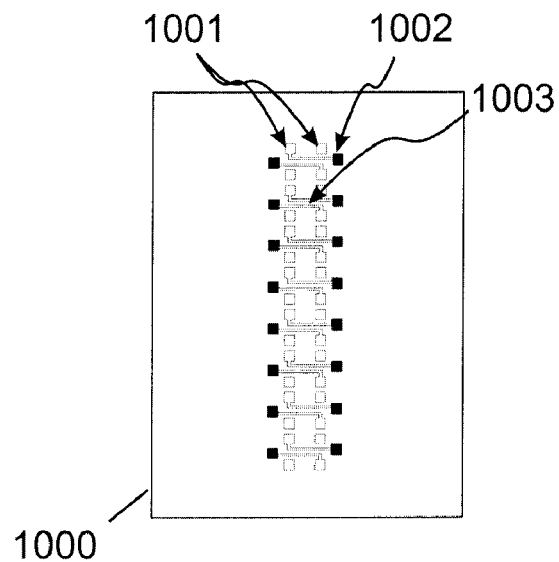
FIG. 10 shows an IC die with center bond pads and having selected I/O terminations redistributed to second locations to provide secondary terminations.

FIG. 10 shows an embodiment of a complementary cross-path IC die 1000 having parallel complementary inner and outer rows of bond pads on the upper surface of a modified IC die. Two parallel inner rows 1001 of bond pads are disposed between two parallel outer rows 1002 of bond pads 1002. A conductor path 1003 coupled to a bond pad from the left hand row of the inner rows 1001 extends to the right, passing between two bond pads of the right hand row of the inner rows 1001, and is coupled to a complementary bond pad on the right hand row of the outer rows 1002. A conductor path 1003 coupled to a respective bond pad from the right hand row of the inner rows 1001 extends to the left, passing between two IC terminals in the left hand row of the inner rows 1001, and is coupled to a complementary bond pad on the left hand row of the outer rows 1002. Conductor paths 1003 can be etched, bonded, or otherwise coupled to the surface of the IC die. Referring to FIGS. 6 and 10, when IC terminals of adjacent first and second IC die 507 are to be connected by means of narrow signal paths 606b, 605 of FIG. 6, the complementary cross-path embodiment of FIG. 10 allows any IC terminal on a first IC die to be connected to any IC terminal on an adjacent IC die. This complementary cross-path structure is therefore useful in IC die utilizing parallel IC terminal arrays. The bond pads 1001, 1002 are coupled to the signal paths 606b, 605 by a suitable means such as wire bonding. The signal path provided through this embodiment can exhibit a variety of advantageous design characteristics, such as fewer electrical stubs, or a more optimal signal path length, thereby reducing signal reflection, skew, and other deleterious signal phenomena.

Figure 11:
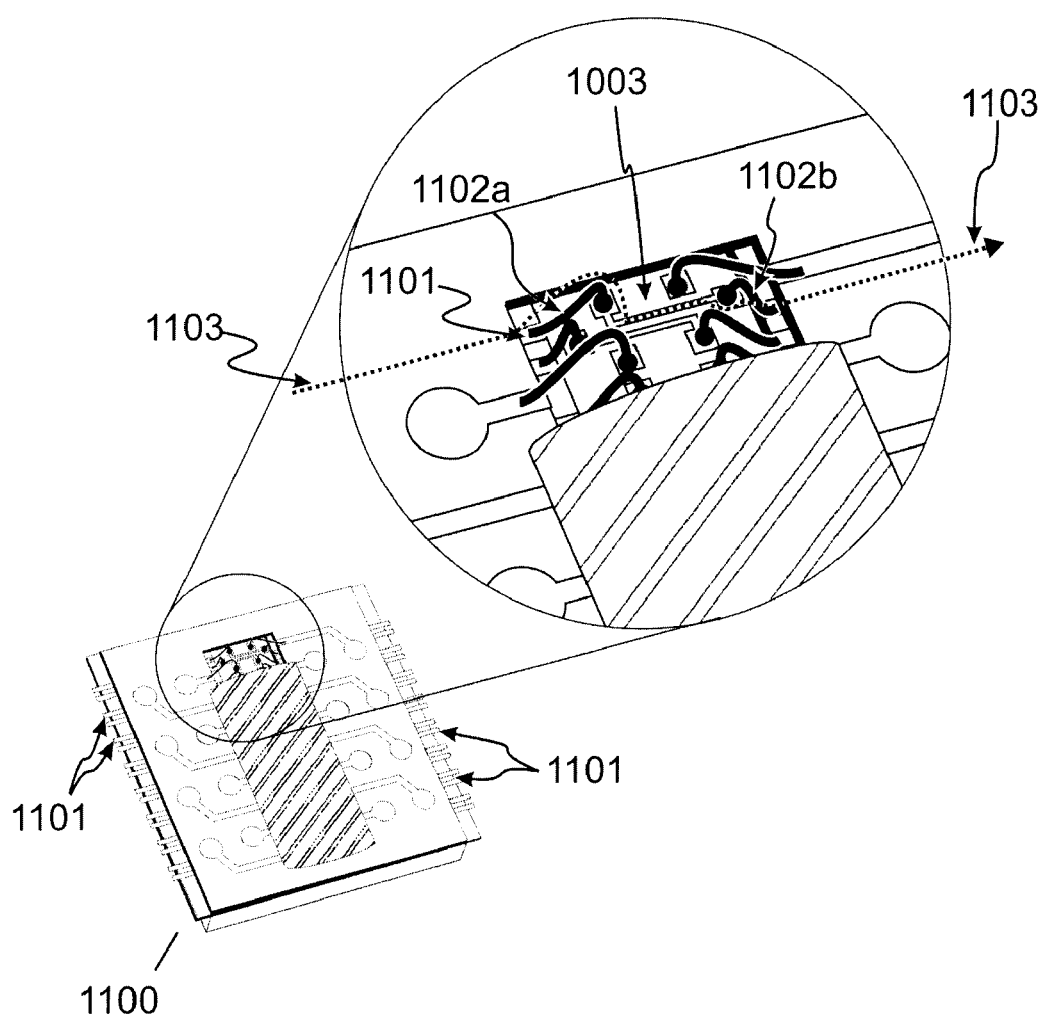
FIG. 11 shows a perspective view of and embodiment of a portion of a strip package with an enlarged area to provide greater detail.

FIG. 11 provides a perspective view and enlargement of a portion of a strip package embodiment 1100 having conductors 1101 disposed along the package edges to interconnect directly to an adjacent IC die or IC chip in the strip package (not shown). In the enlargement, noncontiguous conductive traces 1101 are electrically coupled by bond wires 1102a and 1002b to form a contiguous circuit path 1103 suitable for multi drop interconnection to adjoining ICs in the strip package.

FIGS. 12A and 12B respectively show an assembled top plan view and an exploded view of an embodiment of a portion of an IC package structure 1200. The package assembly includes a first or interior dielectric layer 1201 (the lower dielectric layer in FIG. 12B), which is disposed in the interior of the IC package structure between the IC die 501 and the second (upper) dielectric layer 503. The interior dielectric layer has a left edge 1209, a right edge 1210, and a plurality of apertures 1204 arranged in a line along the center portion of the first dielectric layer. Adjacent apertures 1204 are separated by a dielectric bridge 1203, formed from a continuous portion of the first dielectric layer extending across the center portion of the first dielectric layer. According to the linear arrangement of the apertures 1204 on the interior dielectric layer, for "n" apertures, there are therefore "n–1" dielectric bridges. Conductive paths 1202 extend laterally across the first dielectric layer from the left edge 1209 to the right edge 1210 allowing connection to adjacent ICs on either side (not shown). Electrical continuity from edge to edge is maintained because each of the conductive paths 1202 crosses one of the dielectric bridges 1203, thereby traversing the center section the first dielectric layer. Multiple separate conductive paths, however, can traverse across a single dielectric path. As discussed in conjunction with the enlarged view, the apertures 1204 between the dielectric bridges allow access to bond pads 507 on the IC die 501 and other connective members during fabrication of the IC package 1200.

A second (upper) dielectric layer 503 is disposed above the interior dielectric layer, and has a single aperture 504b extending down the center portion of the layer 530. As discussed above, the shape and location of apertures on the respective layers is according to the location of the bond pads and circuit connection points on an IC die to which the various dielectric layers are coupled. The size of the apertures is sufficient to grant access to the bond pads and connection points during fabrication, according to the size of the tools used in fabrication. Circuit paths 504b are disposed on the upper surface of the upper layer 503. The circuit paths include rounded planar surface areas 504d for interconnection with a next level electronic element, and narrow trace sections 504c extending to the periphery of the aperture 504b and oriented in predetermined positions for interconnection with respective terminals on the IC die.

The enlarged view above FIG. 12A provides greater detail of certain structures in FIGS. 12A and B. The wire bond termination 1204 on dielectric layer 1201. The larger aperture 505b of dielectric layer 503 is identified by peripheral edges 1207a 1207b. The two bond wires 506 in the upper portion of the enlarged view form wire bond connections from select IC die bond pads 507 to respective circuit terminations 504d on the upper dielectric layer 503. The two bond wires 506 in the lower portion of the enlarged view form wire bond connections from select IC die bond pads 507 to conductive circuit terminations 1202a on the lower dielectric layer 1201. The surface of dielectric layer 1201 is seen extending across the aperture from the right peripheral edge 1208A to the left peripheral edge 1208B to form a dielectric bridge 1203, and circuits 1202 disposed on the surface of dielectric layer 1201 are seen on the dielectric bridge 1203, thereby allowing these circuit paths to traverse the aperture 1204.

Returning briefly to FIG. 12A, an encapsulant 703 is disposed within the cavity formed by the aligned apertures. It is shown open at the upper end to expose detail for enlargement. According to a preferred fabrication embodiment, the encapsulant 703 is not deposited in the center cavity until the interior dielectric layer 1201 has been bonded to the IC die 501, the second dielectric layer 503 has been bonded to the interior dielectric layer 1201, and all required bond wires have been secured to their respective terminals and connection points.

Figure 13:
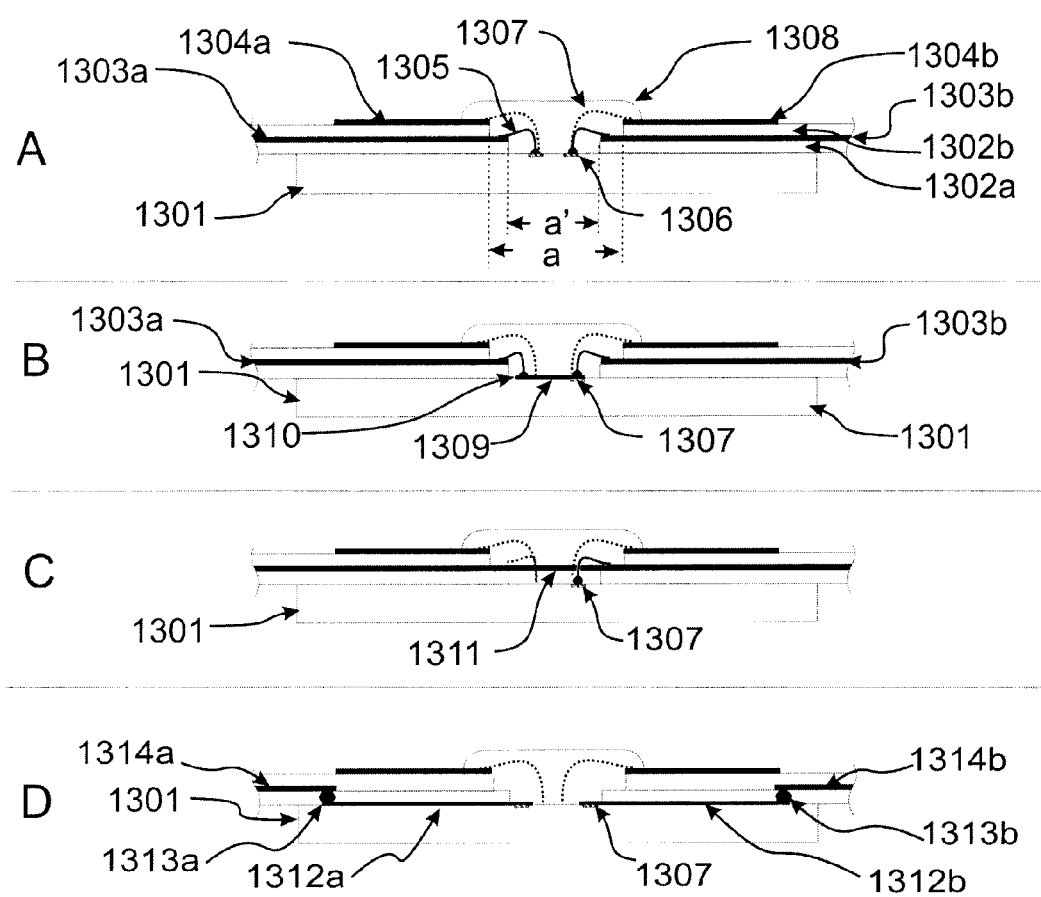
FIG. 13 A-D show in cross section, partial views of various IC package strips embodiments having different interconnection pathways constructions to meet alternative interconnection path requirements.

FIGS. 13 A-13D show in cross section, partial views of various IC die package strip embodiments having different interconnection pathway constructions to meet alternative interconnection path requirements. While the various embodiments are all illustrated with two metal layers (conductive paths disposed on one surface of each of two layered dielectric substrates), this specific number of layers is offered only for example, and embodiments can be utilized with any number of metal layers. For example, an additional conductive layer, disposed either on the top or bottom side of the IC die as oriented in FIGS. 13A-13D, could be used as a ground layer with transmission paths having a predetermined impedance, or a predetermined path length, and thereby configured to reduce signal reflection, signal skew, or counter other transmission effects that erode signal integrity.

In FIG. 13A, an IC die 1301 is depicted with two circuit layers disposed thereupon. The first layer comprises a first dielectric (insulating) layer 1302 with a bottom surface bonded to the IC die. Conductive paths 1303a, 1303b are etched, or otherwise disposed upon the top surface of the first layer dielectric layer 1302a. The second layer comprises a second dielectric layer 1302b having a bottom surface affixed to the top surface of the first layer, and conductive paths 1304a, 1304b formed on the upper surface of the second dielectric layer 1302b. The cross sectional view discloses IC terminations 1306 disposed on the surface of the IC die 1301 within the apertures a and a' and more clearly shows the inner edges of the first (lower) dielectric layer 1302 extending horizontally further toward the center of the aperture than the inner edges of the second (upper) dielectric layer 1302b, thereby creating a tapered or stair-step effect around the cavity formed by apertures a and a' A wire bond 1305 is used to connect from wire bond terminations 1306 on the IC 1301 to the conductors. Phantom bond wires 1307 are illustrated to represent bond wires connected to other bond pads and other connections on other layers. The assembly is shown with an encapsulant 1308 to protect the wire bonds after assembly.

Owing to the limitations of space in FIGS. 13A-13D, many elements that are known to those skilled in the art have been omitted from these Figures, including, but not limited to, protective insulation on conductive paths 1304a and 1304b, or solder balls or other joining material used to electrically couple the bond wires to specific conductive terminals. The omission of these, and other elements from various Figures described herein has been done to reduce visual clutter and enhance illustrative clarity. Accordingly, the omission of such well known structural elements from select Figures is not intended to limit the scope of the embodiments described herein, or of the appended claims.

FIG. 13B shows in a cross section view substantially the embodiment shown in FIG. 11 wherein a conductive path 1309 is interconnected to a first termination point (i.e. bond pad) 1307 on the IC chip 1301 and to a second termination point (e.g bond pad) 1310 completing a circuit across the IC die between wire bonds to first layer circuits 1303a and 1303b.

Figure 12:
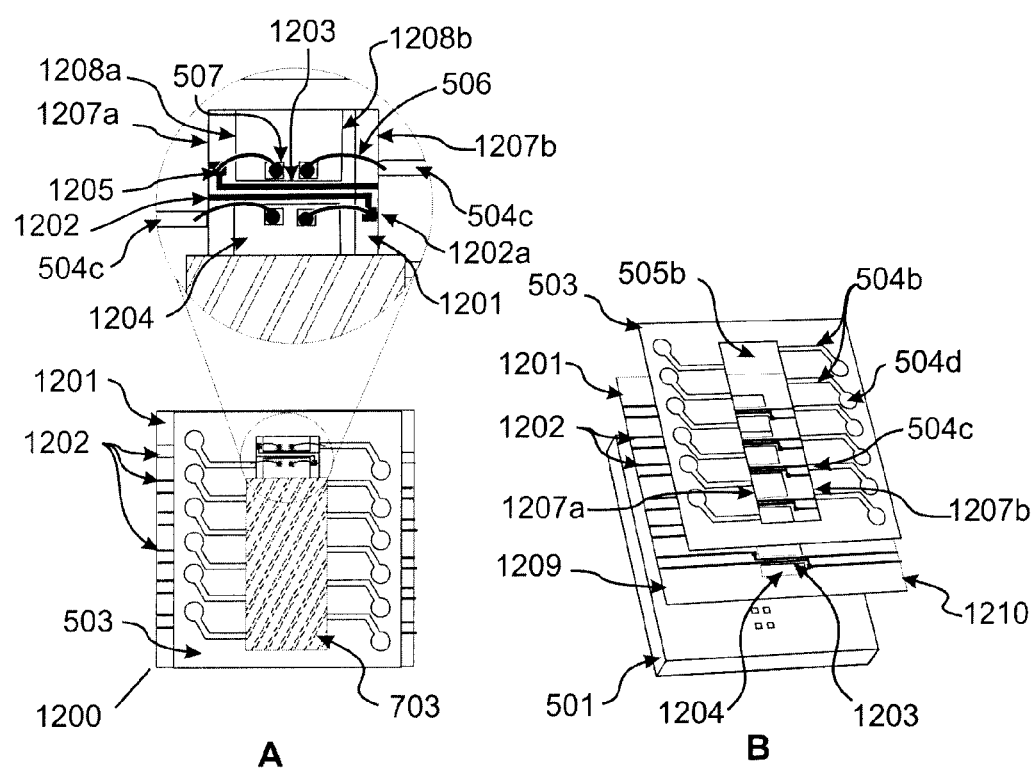
FIGS. 12 A and B disclose assembled. enlarged, and exploded views of an embodiment of a strip package having bridge circuits which cross the bonding apertures to create a multi drop connection path.

FIG. 13C shows in a cross section view what is substantially the embodiment shown in FIG. 12, wherein a conductive circuit pathway 1311 is continuous and bridges and traverses above the chip but is also interconnected to the native chip termination 1307 to provide a multi drop connection path.

FIG. 13 D shows in a cross section a view of an embodiment wherein redistribution circuits 1312a and 1312b are provided on the surface of the IC die 1301 and are interconnected to a first termination point (i.e. bond pad) 1307 on the IC die 1301 disposed beneath the redistribution circuits, and interconnected to circuit paths 1314a and 1314b above the redistribution circuits by second termination members 1313a and 1313b representing any suitable connection means, such as any of several flip chip bonding methods.

Restating here for emphasis, while the structures illustrated in this disclosure have shown with wire bonds being made to two rows of central bond pads on the IC die, the structures are not so limited and could also be used for created using a single bond pad in the center of the IC die or at the edges of the IC die or combinations thereof.

Although the invention has been described briefly with reference to specific exemplary embodiments thereof, it will be evident that various modifications and changes may be made thereto without departing from the broader spirit and scope of the invention as set forth in the appended claims. Moreover, many specific details have been included herein which are not essential to make and use every embodiment of the invention. These details have been included to assist the reader in more easily understanding and comprehending the embodiments described herein. Accordingly, the specification and drawings of this disclosure should be regarded in an illustrative rather than a restrictive sense.

What is claimed:

1. An IC package assembly comprising:
   first and second IC die, each die having an interface surface;
   a first array of IC terminal contacts disposed on the interface surface of the first IC die;
   a second array of IC terminal contacts disposed on the interface surface of the second IC die;
   a first electrically insulating layer with first and second surfaces and a first edge, the first surface of being coupled to the interface surfaces of the first and second IC die, and the first edge having conductive IO terminations configured to electrically couple with an edge connector;
   first and second apertures within the first insulating layer, the first aperture having a first periphery circumscribing at least part of the first array of terminals, and the second aperture having a second periphery circumscribing at least part of the second array of terminals;
   conductive pathways disposed on the second surface, including at first conductive pathway terminating proximate the first periphery and a second conductive pathway terminating proximate the second periphery;
   a first wire bond coupling the first conductive pathway to an IC terminal within the first aperture and a second wire bond coupling the second conductive pathway to an IC terminal within the second aperture;
   a second electrically insulating layer having first and second surfaces, wherein the first surface of the second insulating layer coupled to the second surface of the first insulating layer;
   conductive circuits disposed on the second surface of the second insulating layer;
   a third aperture in the second insulating layer having a third periphery that circumscribes at least part of the first array of IC terminals, and wherein the third periphery circumscribes an area on the second surface of the first insulating layer, including a portion of the first conductive pathway;
   a fourth aperture in the second insulating layer having a fourth periphery that circumscribes at least part of the second array of IC terminals, and circumscribes an area on the second surface of the first insulating layer including a portion of the second conductive pathway.

2. The IC package assembly of claim 1 wherein at least one of the conductive IO terminations on the first edge is coupled to an IC termination among the first array of IC terminal contacts.

3. The IC package assembly of claim 1 further comprising a support base coupled to the first and second IC die.

4. The IC package assembly of claim 3 wherein the assembly support base is a thermal conductor.

5. The IC package assembly of claim 3 wherein the assembly support base is an electrical insulator.

6. The IC package assembly of claim 1 further comprising:
    a fifth aperture formed in the first insulating layer and circumscribing at lest one IC terminal among the first array of IC terminals;
    a dielectric bridge separating the first and fifth apertures; and
    conductive paths traversing the dielectric bridge.

7. The IC package assembly of claim 1 further comprising at least one circuit path on the first surface of the first insulating layer.

8. The IC package assembly of claim 1 wherein the IC die are memory ICs.

9. The IC package assembly of claim 7 wherein the at least one circuit path on the first surface of the first insulating layer is an electrically conductive microstrip configured to exhibit a predetermined impedance, a predetermined circuit path length, or both, between two circuit points.

10. The IC package assembly of claim 1 wherein the first IC die is a memory circuit.

* * * * *